PROCESS FOR COMPOSITE COLOR IMAGE
REPRODUCTION BY STRATUM TRANSFER
Filed June 25, 1965

INVENTOR

ROBERT BERNARD RUFF

BY William B. Gridlin, Jr.

ATTORNEY

United States Patent Office 3,481,736

Patented Dec. 2, 1969

3,481,736

PROCESS FOR COMPOSITE COLOR IMAGE REPRODUCTION BY STRATUM TRANSFER

Robert Bernard Ruff, Kenilworth, N.J., assignor to E. I. du Pont de Nemours and Company, Wilmington, Del., a corporation of Delaware Filed June 25, 1965, Ser. No. 466,997
Int. Cl. G03c *11/12, 7/00;* G03f *1/00*
U.S. Cl. 96—28 9 Claims

ABSTRACT OF THE DISCLOSURE

In a process for color image reproduction where separate photopolymerizable elements each containing different colorants in solid photopolymerizable layers are separately exposed and the underexposed photopolymerizable areas thermally transferred, in order, to the same receptor to give a composite color image reproduction, the improvement which comprises laminating in turn each colored element to said receptor and exposing each separate laminate to a color separation transparency held in register with said receptor, said transparency's color reproduction is equivalent to the color in the particular laminate being exposed, said laminating exposure, and thermal transfer of each successive element occurring in sequence to give a final composite color reproduction. The process is useful in making multi-colored images, including three-color images. Cyan, magenta, and yellow colorants can be used in respective elements. Also, a black colorant can be used in one element.

This invention relates to an image reproduction process and more particularly to a process for obtaining multicolor images in register on a receptor surface from photopolymerizable elements. Still more particularly, it relates to a process for superimposing in register on a receptor surface, multicolor line and/or halftone images produced by the thermal transfer of photopolymerized image-bearing elements.

Various processes for producing copies of an image embodying photopolymerization and thermal transfer techniques are known. In assignee's patent Burg and Cohen 3,060,023, dry processes are described for forming images by photopolymerization. In these processes a photopolymerizable layer coated on a suitable support is exposed imagewise to a process transparency. The surface of the exposed layer is then pressed into contact with the image-receptive surface of a separate element and at least one of said elements is heated to a temperature above the transfer temperature of the underexposed portions of the layer. The two elements are then separated whereby the thermally transferable, underexposed image areas of the layer transfer to the image-receptive element. Related processes involving the transfer of pigments and dyes with the underexposed portions of the layer are disclosed in assignee's U.S. patents Burg and Cohen 3,060,024 and 3,060,025.

The above patents also disclose a related process for reproducing multicolor images, e.g., Example VII of Burg et al., 3,060,023 and Example XI of Burg et al., 3,060,024. In this process, to reproduce a three-color reproduction, each of three-dye-containing photopolymerizable elements were exposed to an appropriate color separation photographic transparency, i.e., either a separation negative or a separation positive. One of the exposed layers was brought into intimate contact with a receptor and a single color image was transferred from the layer to the receptor by thermal transfer, i.e., the unexposed area transferred to the receptor. In like manner after imagewise exposure, the other two exposed layers were superimposed in turn and transferred in register to the same receptor. A three or more color reproduction of the original image can be formed on the receptor following this procedure.

The term "register" as used herein is intended to cover the correct relative placement of the various single color images on the receptor such that a perfect, well-defined multicolor image is formed. Registration can be accomplished visually through the use of register marks on the separation transparencies and the receptor or by use of prepunched transparencies that are mounted on appropriate pins during exposure and transfer.

The above process is useful for multicolor reproduction and particularly useful in the Graphic Art Industry for color proofing. However, obtaining register during the thermal transfer of the second, third, etc., color image to the receptor is difficult due to the heat involved, the differential expansion of the receptor and the support on which the photopolymerized layer is coated, and the critical positioning of the photopolymerized element on the receptor during heating. For high quality multicolor reproduction work, this difficulty presents the need for costly and sophisticated thermal transfer machines.

Therefore, it is an object of this invention to provide a new and practical process for reproducing multi-color images. Another object is to provide such a process that produces multicolor images in register from the thermal transfer of photopolymerized image-bearing elements. Another object is to provide a process for forming multicolor images that avoids the problems inherent in registration during thermal transfer. A further object is to provide a process which is simple and dependable for producing multicolor thermal transfer images. A still further object is to provide such processes which utilize simple and economical apparatus. Still further objects will be apparent from the following description of the invention.

These and other objects are accomplished by the process for preparing multicolor reproduction prints from individual photopolymerizable elements where each element has a separate colorant in a photopolymerizable layer that is solid below 40° C. and tacky between 40° C. and 220° C., said process comprises (A) laminating a receptor to a photopolymerizable element containing a colorant equivalent to the color to be printed by a color separation transparency, (B) exposing said element through said color separation transparency, (C) heating and separating the exposed photopolymer from the unexposed photopolymer to give a colored reproduction of said transparency on said receptor, (D) post exposure of image-bearing surface of receptor, (E) laminating said imaged receptor to a second photopolymerizable element containing a different colorant from that of step (A), (F) exposing said second lamination through a second color separation transparency held in register with the reproduction, the color reproduction of said second transparency being equivalent to the colorant of said second laminate, and (G) heating and separating the exposed photopolymer from the unexposed photopolymer to give a multicolor image.

Exposure (A), the first exposure, should be in register if pins or similar means are used for registration. If visual registration is used, this first exposure need not be in register but the subsequent exposures are in visual register.

In practicing the invention it may be desirable to precondition the receptor by waxing the image-receptive surface or coating the photopolymerizable stratum with an appropriate coating prior to lamination. This operation is to avoid delamination and tearing in the subsequent separation. Additionally, after each exposure and separation, it may be desirable to pass the image-bearing receptor with a suitable cover sheet between heated pressure rolls to increase color saturation and intensity. These additional steps would be taken prior to each subsequent lamination of receptor to a different color-containing photopolymerizable stratum.

While the structures of the various process elements during the various steps of the process of the invention are apparent from the description given above and below, for convenience representative elements are set forth in the attached drawing which constitutes a part of the specification wherein.

Figure 1:
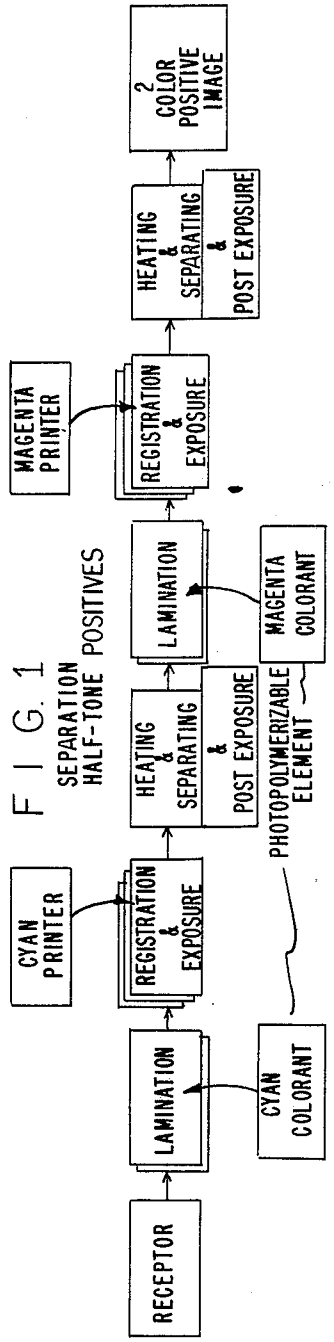
FIG. 1 is a schematic diagram of an embodiment of the invention illustrating the reproduction of a two-color image.

In practicing the invention, the difficulty of registering the various color images during thermal transfer is eliminated by the pre-exposure lamination of the photopolymerizable stratum or matrix to the receptor and exposing the laminate to a color-separation transparency in register with the receptor. The invention will now be described in connection with the preparation of color proofs. In the graphic arts it is desirable to produce a four or more color proof to assist a color etcher in correcting a set of color printers prior to using them to produce color plates and also to reproduce the color quality that will be obtained during the printing process. It should be understood that such description is merely exemplary in that the process of the invention may be adapted to other processes wherein a multi-color reproduction is desired.

A receptor, preferably the paper which will be printed on ultimately by the color plates, can be coated with a thin (about 0.001 inch thick or less) stripping layer, e.g., a wax such as paste wax manually applied to its image receptive surface. This wax layer, although not always necessary, helps preclude tearing of the receptor during subsequent stripping operations. Alternatively, the surface of the matrix can be coated with an appropriate layer to accomplish the same purpose, e.g., an unexposed photopolymerizable element can be coated with solution which combines 100 cc. of 10% Saponin solution, 25 cc. of 5% polyvinyl alcohol (51–05), and 50 cc. of 5% polyvinyl alcohol (71–30) and dried. Then the image receptive surface of the receptor is thermally laminated to the unexposed photopolymerizable matrix. The lamination can be accomplished by many devices, e.g., passing the receptor-matrix sandwich through heated pressure rollers, a heated press, heated pressure plates or platens. The conditions of the lamination, i.e., temperature, time, and pressure must be such that the finished laminate has good contact between the various layers and no air bubbles are present. Depending upon the particular matrix used, the following is the general range of temperatures and pressures involved: 90°–130° C. and 20–80 p.s.i.

The matrix used in the process has been coated on a transparent support, such as polyethylene terephthalate which can be coated with a resin subbing layer that is disclosed in U.S. patent Alles et al., U.S. 2,627,088, i.e., a copolymer of vinylidene chloride/methyl acrylate/itaconic acid. As the exposure is normally through the support, it should be as thin as possible to avoid problems of loss of dot fidelity and image spreading. The matrix will contain a colorant, i.e., either finely ground pigments, monomelecular dyes, or polymeric dyes such as disclosed in assignee's pending patent application Seide, S.N. 340,-491, filed Jan. 27, 1964, U.S.P. 3,376,136, Apr. 2, 1968. The colorant should be one, such that when it is transferred to the receptor, its color values approximate the color values that will be produced by the printing ink that is to be used. Under these conditions, the color proof will simulate the true printing. In color proofing a four-color image, four separate matrices are needed. The matrices need only differ in the colorants used, each one will usually contain one of the following colorants: cyan, magenta, yellow, and black; however, other colors can be used.

After lamination, a color separation halftone positive transparency is brought into intimate contact with the matrix support. This positive silver image transparency is used to produce a positive photopolymer image on the receptor, and the receptor image is used to colorproof positive working printing plates. The particular color separation transparency is one that will print the same color that is in the matrix, i.e., if the matrix contains a cyan colorant, the separation transparency is one that will be used to make the plate print cyan. The image-bearing emulsion layer of the positive transparency can be placed against the transparent support of the matrix if lateral image reversal is desired, i.e., a wrong-reading image on the transparency will reproduce a right-reading image on the receptor. If the support side of the transparency is placed against the matrix support, the image on the receptor will be an exact copy of that on the transparency, i.e., if transparency is right-reading so will be the image on the receptor.

The elements are then exposed in a suitable exposure device, e.g., vacuum frame with an arc light, the exposure being through the transparency and the matrix support. The relative position of the various elements during this initial exposure is illustrated in FIG. 1. The conditions of exposure are such that substantial addition polymerization takes place in the exposed areas to form an addition polymer and no significant polymerization takes place in the underexposed areas. The term "underexposed" as used herein is intended to cover the image areas which are completely unexposed or partially exposed so that there is a material amount of the addition polymerizable compound still present and insufficient addition polymer image has been formed to bind the constituents. In the underexposed image areas the softening temperature of the matrix remains substantially lower than that of the complementary exposed image areas. This difference in softening temperature is known to the art e.g., see U.S. Patent 3,060,023.

After exposure, the transparency is removed and the laminate is heated to a temperature of at least 40° C., the temperature depending upon the composition of the matrix and generally in the range between 40°–110° C. After the heat has been applied for a short period of time, the receptor is separated from the matrix, e.g., by manually stripping them apart. The heating and stripping can be performed in one operation by heating the laminate on a rotating, heated cylinder and manually stripping the matrix from its support as the cylinder rotates. The underexposed areas, which correspond to the opaque areas on the color separation transparency, remain on the receptor to form a cyan image, leaving the exposed areas adhering to the support.

If at this time, it appears that the image on the receptor does not have the desired color intensity, the image can be ferrotyped, i.e., a thin sheet of polymeric film, e.g., polyethylene terephthalate, is placed over the imaged surface of the receptor and the sandwich is run through heated pressure rollers. This operation, a calendering-type process, increases the color saturation and intensity. The thin sheet of film is then removed at room temperature and the image on the receptor is exposed to actinic light to harden it, i.e., an addition polymer image is formed. This step is necessary to avoid transfer of the polymer image during subsequent lamination and stripping operations.

If desirable the image-bearing surface of the receptor can be rewaxed at this time to prevent subsequent tearing. However, this operation is not necessary if the surface of the photopolymerizable matrices have been coated with an overlayer as previously described. The image-bearing surface of the receptor is then laminated to a second unexposed photopolymerizable matrix containing a different colorant. The laminate is exposed as previously explained to another color separation transparency, e.g., if the second matrix has a magneta colorant, the transparency would be a magenta-printer, separation halftone positive.

Prior to this exposure the magenta-printer transparency is placed in register with the cyan image on the receptor. This registration can be accomplished by any of the several means known in the printing art, e.g., visually by superimposing registration marks on the receptor and the transparency or details of the image, or by use of punched holes in the separation positives and the receptor and appropriate pins on the exposure means.

After the exposure, the sliver-image transparency is removed and the matrix-receptor sandwich is heated and stripped as previously explained. The two-color image on the receptor can be ferrotyped and post-exposed to harden. Subsequently, additional color images, e.g., yellow and black, can be applied in register to the receptor following the same procedures of pre-exposure lamination, registration, exposure theremal delamination, and post-exposure. The order of color laydown is not critical and can be varied from the usual order of yellow, magenta, cyan and black.

The process is also applicable when it is desired to produce a positive photopolymer image from color separation halftone negatives, although an additional step must be taken. The following procedure would be followed when it is desirable to color proof negative color separation transparencies.

The receptor, after being pre-conditioned as described earlier, is laminated to an unexposed photopolymer matrix. The matrix is of the same composition as in the positive working system, however the matrix has been coated on an untreated or unsubbed transparent support, i.e., the adhesion between the photopolymerizable layer and the support is less than that between the photopolymerizable layer and a resin subbed support.

After lamination, the unsubbed support can be stripped away and the photopolymerizable layer will remain adhered to the receptor. This is because the adhesion of the photopolymerizable layer to the receptor at room temperature is greater than the adhesion of the photopolymerizable layer to the untreated support. Optically, the lamination can be exposed and then the unsubbed support stripped away. During exposure, a color separation negative is brought into contact with either the photopolymer layer support or the photopolymerizable layer if the support has been stripped away and the elements are exposed in a vacuum frame to an arc light.

The separation negative is removed and the imagewise exposed photopolymerizable layer, which is adhered to the receptor, is thermally laminated to a support whose surface has good anchoring properties, e.g., a polyester (polyethylene terephthalate) support that has been coated with a copolymer of vinylidene chloride/methyl acrylate/itaconic acid as disclosed in Alles et al., U.S. 2,627,088. The lamination can be accomplished by pressure rolls heated to 95–110° C. The underexposed areas in the matrix layer will adhere to the subbed support, i.e., after the thermal lamination the adhesion between the underexposed photopolymer and the subbed support is greater than the adhesion between the underexposed photopolymer and the receptor.

At this time, the laminate is partially exposed to actinic light for 10 sec. to several minutes, this over-all exposure hardens and anchors the previously underexposed areas to the subbed support and also prevents their cohesive failure during subsequent stripping. The laminate is then heated to about 100° C. on a rotary, heated cylinder and the subbed support is stripped off manually. The initially partially exposed or underexposed areas adhere to the support and the fully exposed areas remain on the receptor, i.e., leaving a positive image on the receptor. This process is then repeated for each color involved, registering each color separation negative with the positive image on the receptor.

Additionally, the above procedure can be followed with a set of uniform sized color separation positives and will produce negative image on the receptor.

The process of pre-exposure lamination of matrix and receptor can be adapted to many photopolymerizable compositions—one solid photopolymerizable composition that is useful comprises:

(a) A thermoplastic polymeric compound solid at 50° C., 3 to 97 parts by weight;

(b) An ethylenically unsaturated compound containing one or more terminal ethylenic groups, having a boiling point above 100° C. at normal atmosphere pressure, being capable of forming a high polymer by photoinitiated addition polymerization and having a plasticizing action on the thermoplastic polymeric compound, 97 to 3 parts by weight;

(c) A free-radical generating addition polymerization initiator, activatable by actinic light and inactive thermally below 185° C., 0.001 to 10.0 parts by weight, and in addition if desired;

(d) A thermal polymerization inhibitor, 0.001 to 6.0 parts by weight.

Components (a) and (b) can be combined as a single material serving the function of both monomer and polymer in which case the ethylenic unsaturation can be present as an extralinear substituent attached to a thermoplastic linear polymer, such as polyvinyl acetate/acrylate, cellulose acetate/acrylate, cellulose acetate/methacrylate, N-acrylyloxymethyl polyamide, etc. It is also possible to have a mixture of unsaturated monomer and polymers.

Suitable thermoplastic polymers for component (a) include:

(A) Copolyesters, e.g., those prepared from the reaction product of a polymethylene glycol of the formula $HO(CH_2)_nOH$, wherein $n$ is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophathalic and sebacic acids and (ii) terephthalic, isophthalic, sebacic and adipic acids.

(B) Nylons or polyamides, e.g., N-methoxymethyl polyhexamethylene adipamide;

(C) Vinylidene chloride copolymers, e.g., vinylidene chloride/acrylonitrile; vinylidene chloride/methacrylate and vinylidene chloride/vinylacetate copolymers;

(D) Ethylene/vinyl acetate copolymers;

(E) Cellulosic ethers, e.g., methyl cellulose, ethyl cellulose and benzyl cellulose;

(F) Polyethylene;

(G) Synthetic rubbers, e.g., butadiene/acrylonitrile copolymers, and chloro-2-butadiene-1,3-polymers;

(H) Cellulose esters, e.g., cellulose acetate, cellulose acetate succinate and cellulose acetate butyrate;

(I) Polyvinyl esters, e.g., polyvinyl acetate/acrylate, polyvinyl acetate/methacrylate and polyvinyl acetate;

(J) Polyacrylate and alpha-alkyl polyacrylate esters, e.g., polymethyl methacrylate and polyethyl methacrylate;

(K) High molecular weight polyethylene oxides of polyglycols having average molecular weights from about 4,000 to 1,000,000;

(L) Polyvinyl chloride and copolymers, e.g., polyvinyl chloride/acetate;

(M) Polyvinyl acetal, e.g., polyvinyl butryal, polyvinyl formal;

(N) Polyformaldehydes;

(O) Polyurethanes;

(P) Polycarbonates; and (Q) Polystyrenes.

To the thermoplastic polymer constituent of the photopolymerizable composition there can be added nonthermoplastic polymeric compounds to improve certain desirable characteristics, e.g., adhesion to the base support, adhesion to the image-receptive support on transfer, wear properties, chemical inertness, etc. Suitable non-thermoplastic polymeric compounds include polyvinyl alcohol, cellulose, anhydrous gelatin, phenolic resins and melamineformaldehyde resins, etc. If desired, the photopolymerizable layers can also contain immiscible polymeric or non-polymeric organic or inorganic fillers or reinforcing agents which are essentially transparent at the wave lengths used for the exposure of the photopolymeric material, e.g., the organophilic silicas, bentonites, silica, powdered glass, colloidal carbon, as well as various types of dyes and pigments. Such materials are used in amounts varying with the desired properties of the photopolymerizable layer. The fillers are useful in improving the strength of the compositions, reducing tack and in addition, as coloring agents.

Suitable free-radical initiated, chain-propagating addition polymerizable ethylenically unsaturated compounds for use as components (b) include preferably an alkylene or a polyalkylene glycol diacrylate prepared from an alkylene glycol or 2 to 15 carbons or a polyalkylene ether glycol of 1 to 10 ether linkages, and those disclosed in Martin and Barney U.S. Patent 2,927,022, issued Mar. 1, 1960, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures. The following specific compounds are further illustrative of this class; unsaturated esters of alcohols, preferably polyols and particularly such esters of the α-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, the bis-acrylates and methacrylates of polyethylene glycols of molecular weight 200–500, and the like; unsaturated amides, particularly those of the α-methylene carboxylic acids, and especially those of α-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, bis(gamma - methacrylamidopropoxy) ethane β-methacrylamidoethyl methacrylate, N-(beta-hydroxyethyl)-β-(methacrylamide) ethyl acrylate and N,N-bis(β-methacryloxyethyl)acrylamide; vinyl esters such as divinyl succinate, divinyl adipate, divinyl phthalate, divinyl terephthalate, divinyl benzene-1,3-disulfonate, and divinyl butane-1,4-disulfonate; styrene and derivatives thereof and unsaturated aldehydes, such as sorbaldehyde (hexadienal). An outstanding class of these preferred addition polymerizable components are the esters and amides of α-methylene carboxylic acids and substituted carboxylic acids with polyols and polyamides wherein the molecular chain between the hydroxyl and amino groups is solely carbon or oxygen-interrupted carbon. The preferred monomeric compounds are difunctional, but monofunctional monomers can also be used. In addition, the polymerizable, ethylenically unsaturated polymers of Burg U.S. Patent 3,043,805, Martin U.S. Patent 2,929,710 and similar materials may be used alone or mixed with other materials.

A preferred class of free-radical generating addition polymerization initiators activatable by actinic light and thermally inactive at and below 185° C. includes the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloro-anthraquinone, 2-chloro-anthraquinone, 2-methylanthraquinone, 2-ethyl-anthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone α-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photo initiators which are also useful, even though some may be thermally active at temperatures as low as 85° C., are described in Plambeck U.S. Patent 2,760,863 and include vicinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc.; α-hydrocarbon substituted aromatic acyloins, including α-methylbenzoin, α-allylbenzoin, and α-phenylbenzoin.

Suitable thermal polymerization inhibitors that can be used in photopolymerizable compositions include p-methoxyphenol, hydroquinone, and alkyl and aryl-substituted hydroquinone, and quinones, tert-butyl catechol, pyrogallol, copper resinate, naphthylamines, β-naphthol, cuprous chloride, 2,6-di-tert-butyl p-cresol, phenothiazine, pyridine, nitrobenzene and dinitrobenzene. Other useful inhibitors includes p-toluquinone and chloranil, and thiazine dyes, e.g., Thionine Blue G (C.I. 52025), Methylene Blue B (C.I. 52015) and Toluidine Blue O (C.I. 52040).

Various dyes, pigments, thermographic compounds and color-forming components can be added to the photopolymerizable compositions to give varied results after the thermal transfer. These additive materials, however, preferably should not absorb excessive amounts of radiation at the exposure wave length or inhibit the polymerization reaction.

Among the dyes useful in the invention are Fuchsine (C.I. 42510), Auramine Base (C.I. 41000B), Calcocid Green S (C.I. 44090), Para Magenta (C.I. 42500), Tryparosan (C.I. 42505), New Magenta, (C.I. 42520), Acid Violet RRL (C.I. 42425), Red Violet 5RS (C.I. 42690), Nile Blue 2B (C.I. 51185), New Methylene Blue GG (C.I. 51195), C.I. Basic Blue 20 (C.I. 42585), Iodine Green (C.I. 42556), Night Green B (C.I. 42115), C.I. Direct Yellow 9 (C.I. 19540), C.I. Acid Yellows 17 (C.I. 18965), C.I. Acid Yellow 29 (C.I. 18900), Tartrazine (C.I. 19140), Supramine Yellow G (C.I. 19300), Buffalo Black 10B (C.I. 27790), Naphthalene Black 12R (C.I. 20350), Fast Black L (C.I. 51215), and Ethyl Violet (C.I. 42600).

Suitable pigments include, e.g., $TiO_2$, colloidal carbon, graphite, phosphor particles, ceramics, clays, metal powders such as aluminum, copper, magnetic iron and bronze, etc. The pigments are useful when placed in the photosensitive layer or in an adjacent nonphotosensitive layer. The dye or pigments selected can be those which are actually used in the inks for printing.

Useful thermographic additives, e.g., 3-cyano-4,5-dimethyl - 5 - hydroxy - 3 - pyrrolin - 2 - one are disclosed in Howard, U.S. 2,950,987. Such compounds, in the presence of activators, e.g., copper acetate, are disclosed in assignee's Belgian Patent 588,328. Other useful thermographic additives are disclosed in the following U.S. patents: 2,625,494; 2,637,657; 2,663,654; 2,663,655; 2,663,656 and 2,663,657.

Suitable color-forming components which form colored compounds on the application of heat or when brought in contact with other color-forming components on a separate support include:

(1) Organic and inorganic components; dimethyl glyoxine and nickel salts; phenolphthalein and sodium hydroxide; starch/potassium iodide and oxidizing agent, i.e., peroxides; phenols and iron salts; thioacetamide and lead acetate; silver salt and reducing agent, e.g., hydroquinone;

(2) Inorganic components; ferric salts and potassium thiocyanate; ferrous salts and potassium ferricyanide; copper or silver salts and sulfide ions; lead acetate and sodium sulfide; and (3) Organic components: 2,4-dinitrophenylhydrazine and aldehydes or ketones; diazonium salt and phenol or naphthol, e.g., benzene diazonium chloride and β-naphthol; p-dimethylaminobenzaldehyde and p-diethylamino-aniline.

Useful polymeric dyes are disclosed in assignee's patent application, Seide, S.N. 340,491 filed Jan. 27, 1964 (U.S. Patent 3,376,136). These polymeric dyes have recurring extralinear dye nuclei and a molecular weight of at least 10,000 e.g., a polymeric amine having intralinear imine linkages and extralinear dye nuclei attached to the intralinear nitrogen atoms, a cellulose derivative having dye nuclei linked to the cellulose chain through an ether group.

The photopolymer stratum can have a removable cover sheet as described in Heiart U.S. 3,060,026 which may be stripped before lamination to the receptor before exposure.

The film support for the photopolymerizable composition used in the process may be any suitable transparent plastic. For example, the cellulosic supports, e.g., cellulose acetate, cellulose triacetate, cellulose mixed esters, etc., may be used. Polymerized vinyl compounds, e.g., copolymerized vinyl acetate and vinyl chloride, polystyrene, and polymerized acrylates may also be mentioned. The film formed from the polyesterification product of a dicarboxylic acid and a dihydric alcohol made according to the teachings of Alles, U.S. Patent 2,779,684 and the patents referred to in the specification of that patent. Other suitable supports are the polyethylene terephthalate/isophthalates of British Patent 766,290 and Canadian Patent 562,672 and those obtainable by condensing terephthalic acid and dimethyl terephthalate with propylene glycol, diethylene glycol, tetramethylene glycol or cyclohexane 1,4-dimethanol (hexahydro-p-xylene alcohol). The films of Bauer et al. U.S. Patent 3,052,543 may also be used. The above polyester films are particularly suitable because of their dimensional stability. The supports are generally about 0.0004 to 0.007 inch thick.

The image receptive support to which the image is transferred must also be stable at the operating temperatures. The particular support used is dependent on the desired use for the transferred image and on the adhesion of the image to the base. Additionally, if the image is composed of half-tone dots, the image receptive surface will have to be smooth for quality dot reproduction. Suitable supports include paper, including bond paper, resin coated or impregnated paper, cardboard, metal sheets, foils, e.g., aluminum, copper, steel, bronze, tin, etc.; glass, polyethylene, linear condensation polymers such as the polyesters, e.g., polyethylene terephthalate, regenerated cellulose, and cellulose esters, e.g., cellulose acetate.

When the photopolymer strata are exposed, they can be exposed to actinic radiation through a set of uniformly sized color separation transparencies, e.g., a process separation negatives or separation positives. The process color separation transparencies are made by processes known in the art, the multicolor original is photographed several times through various color filters to produce a separate transparency for each filter. Each transparency will print only the colors that its filter allows to pass. Although usually the separation transparencies will print yellow, cyan, magenta, and black, others can be used such as pink, gray, or dark blue printers.

Since free-radical generating addition-polymerization initiators activatable by actinic radiation generally exhibit their maximum sensitivity in the ultraviolet range, the radiation source should usually furnish an effective amount of this radiation. Such sources include carbon arcs, mercury-vapor arcs, fluoroescent lamps with ultraviolet radiation-emitting phosphors, argon glow lamps, electronic flash units and photographic flood lamps. Of these, the mercury vapor arcs are customarily used at a distance of one and one-half to 20 inches from the photopolymerizable layer. It is noted, however, that in certain circumstances it may be advantageous to expose with visible light, using a photoinitiator sensitive in the visible region of the spectrum, e.g., 9,10-phenanthrenequinone. In such cases, the radiation source should furnish an effective amount of visible radiation. Many of the radiation sources listed above furnish the required amount of visible light.

This invention will be further illustrated by, but is not intended to be limited to the following examples:

EXAMPLE I

A matrix was prepared from a coating solution of 550 g. of a 15% by weight solution in trichloroethylene of cellulose acetate butyrate, 60 g. of pentaerythritol triacrylate, 45 g. of triethylene glycol diacetate, 5.0 g. of 2-ethyl-anthraquinone, 12.5 g. of a cyan printing ink pigment, Hallmark Colormaster CM 5203/M–10035, sold by Acme Printing Ink Co., Chicago, Ill., and trichloroethylene to make 1375 g. The cellulose acetate butyrate contained 13% acetyl groups, 37% butyryl groups, 2% hydroxyl groups and had a viscosity of 1.12–1.88 poises determined by ASTM method D–1343–54T in a solution described as Formula A, ASTM method D–871–54T.

Two similar compositions were prepared, but instead of the cyan pigment, to one 12.5 g. of magenta printing ink pigment, Hallmark Colormaster CM 5103/M–10034 sold by Acme Printing Ink Co., was added and to the other 18.7 g. of a yellow printing ink pigment, Hallmark Colormaster CM–5004/M–10033 also sold by Acme, was added. The resulting dye-containing photopolymerizable solutions were individually mixed in a ball-mill and coated on 0.004 inch thick polyethylene terephthalate film supports, which had been subcoated with the copolymer of vinylidene chloride/methyl acrylate/itaconic acid as disclosed in Alles et al., U.S. 2,627,088, to give a dry coating thickness of 0.15–0.20 mil. The coatings were dried by hot air in the dark and 0.0005 inch thick films of polyethylene terephthalate were laminated to the coatings by passing them through pressure rollers heated to 100° C.

The laminate i.e., the thin film of polyethylene terephthalate, was removed from the cyan photopolymerizable coating and the matrix, i.e., the photopolymerizable coating on the support, was laminated to a paper receptor, Kromkote Cast Coated 10 point paper, the coating against the receptor. Prior to the lamination, the image receptive surface of the receptor was waxed with a paste wax (Johnson's Paste wax). The lamination was accomplished by bringing the image receptive surface of the receptor into contact with the photopolymerizable layer and passing the sandwich through pressure rollers heated to 100–110° C.

The receptor-cyan photopolymer matrix sandwich was brought into contact with a cyan-printer, color separation halftone positive, with the emulsion side of the positive against the film support of the matrix. At this time, the sandwich of elements was the same as that illustrated in FIG. 1. The matrix was then exposed through the film support on a vacuum frame to a NuArc "Flip Top" arc lamp for 5 seconds; the lamp is manufactured by NuArc Co., Chicago, Ill., and described in U.S. Patents 2,774,907 and 2,754,446. The silver-image, color separation positive was removed and the matrix-receptor sandwich was passed between 2 rollers, one a rotating cylinder heated to 95–110° C. The receptor was pressed against the heated cylinder with a pressure of approximately 6 pounds per square inch. After 15–20 seconds the matrix and its support were stripped off, leaving the underexposed areas of the matrix on the paper receptor and the exposed areas on the film support. The underexposed areas remaining on the receptor formed the cyan image.

The cyan image on the receptor was then "ferrotyped" to increase color saturation and intensity. This ferrotyping was accomplished by bringing a thin sheet of polyethylene terephthalate into contact with the image on the receptor and passing both elements through pressure rollers heated to 100–110° C. The thin sheet was removed after cooling to room temperature, and the cyan image on the receptor was exposed in a vacuum frame to the NuArc arc lamp for five minutes; this operation was to harden the cyan image and prevent back transfer during subsequent thermal transfer of the other colored images. After the "post exposure" the receptor was again waxed with a paste wax (Johnson's Paste wax).

The waxed, cyan image bearing receptor surface was then laminated to the unexposed magenta matrix, the cover sheet over the magenta coating having been removed. The lamination was accomplished by passing the sandwich through pressure rollers heated to 100–110° C.

A magenta-printer, color separation halftone positive was brought into contact with the support for the magenta matrix, emulsion side of the positive against the support. The positive was visually registered with the cyan image on the receptor by aligning the registration marks. Then the elements were exposed the same as with the cyan matrix and the same subsequent steps of thermal delamination, ferrotyping and post exposure were performed. The yellow matrix was also processed in the same manner. A well defined, high-contrast, three color reproduction of the original image was formed on the paper sheet. Part of this example wherein the cyan and magenta images are reproduced is illustrated in FIG. 1.

EXAMPLE II

Three photopolymerizable compositions were prepared as set forth in Example I except the cyan colorant was Monastral Fast Blue G pigment (C.I. 74160), the yellow pigment was Benzidine Yellow AA (C.I. 21090) and the magenta was Rhodamine Y pigment (C.I. 45160). The compositions were coated on unsubbed polyethylene terephthalate film supports. The cyan matrix was laminated to a paper receptor, Warren Lustro 80# paper. The film support for the photopolymerizable layer was brought into contact with the emulsion side of a silver image, cyan printing, color separation negative. The matrix was then exposed through the film support by the NuArc arc lamp for 1.5 minutes.

After the exposure and while at room temperature, the unsubbed polyethylene terephthalate laminate was stripped from the receptor-matrix sandwich. The photopolymerized matrix containing the latent image remained adhered to the paper receptor.

The matrix was then laminated to a 0.004 inch thick polyethylene terephthalate film support which had been subcoated with the copolymer of vinylidene chloride/methyl acrylate/itaconic acid as disclosed in Alles et al., U.S. 2,627,088. The lamination was accomplished by passing the sandwich between rollers heated to 95–100° C. After the lamination, the underexposed areas of the matrix adhered to the subcoated film support and the exposed areas did not.

The sandwich of matrix and subcoated film support was then given an over-all exposure to the NuArc arc lamp for 15 seconds. This exposure anchored the previously underexposed areas of the matrix to the subbed film support and prevented cohesive failure of the photopolymer layer in said previously unexposed areas.

The sandwich was then passed between two rollers, one heated to 95–105° C.; the receptor in contact with the heated roller. While the sandwich was still being heated, the subbed film support was stripped off. The original underexposed areas remained on the film support while the original exposed area remained on the receptor.

Figure 2:
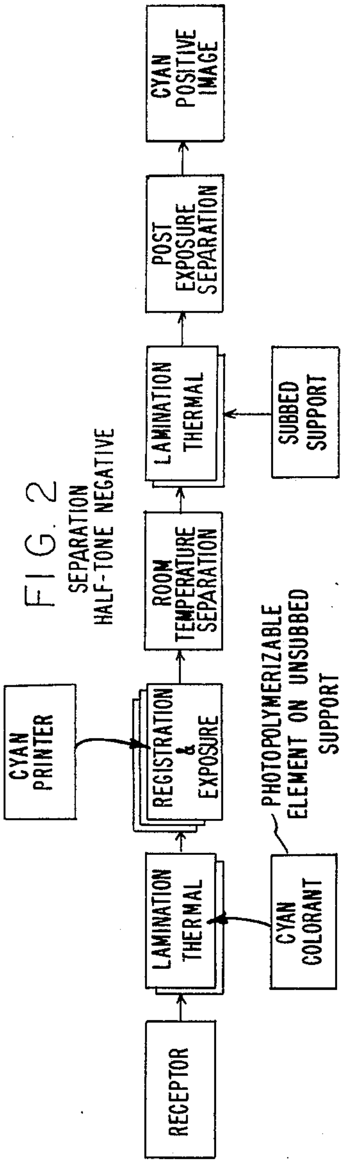
FIG. 2 is a schematic diagram of another embodiment of the invention illustrating the reproduction of a cyan positive image from a cyan printer color separation negative.

The receptor had a positive cyan image. This image was ferrotyped as in Example I and the receptor was rewaxed. The steps were then repeated for the magenta and the yellow photopolymerizable matrices, with the color separation negatives in register with the image on the receptor during exposure. A well-defined, three-color positive image of the original image was formed on the paper receptor. Part of this process, i.e., forming the cyan image, is illustrated in FIG. 2.

EXAMPLE III

Example II was repeated except that a set of uniformly sized color separation positives were used during the exposure instead of separation negatives. This resulted in a well-defined, three-color negative image of the original image on the receptor.

EXAMPLE IV

A photopolymerizable composition was prepared from 2 g. of low viscosity polyvinyl acetate methacrylate (containing a maximum of 20 mole percent of methacrylyl groups), 12 ml. of ethanol, 2.54 g. of polyethylene glycol diacrylate (made from a mixture of polyethylene glycols having an average molecular weight of about 300), 0.009 g. of anthraquinone and 0.009 g. of p-methoxyphenol. To a one-third portion of the photopolymerizable composition there was added 0.06 g. of a blue-green dye, Calcocid Green S (C.I. 44090), in 4 ml. of ethanol. Two similar compositions were prepared adding to one 0.06 g. of a magenta dye, Fuchsine (C.I. 42510), in 4 ml. of ethanol and to the other 0.06 g. of a yellow dye, Auramine Base (C.I. 41000B), in 4 ml. of ethanol. The resulting dye-containing photopolymerizable solutions were cast to a wet thickness of 1 mil on polyethylene terephthalate film supports as described in Example I and the layers were allowed to dry in the dark. Firm, dry layers, 0.5-mil thick, were obtained.

Each of the layers was then manually coated with the following overcoat solution:

| | Cc. |
|---|---|
| 10% saponin solution [1] | 100 |
| 5% polyvinyl alcohol (51–05) [1] | 25 |
| 5% polyvinyl alcohol (71–30) [1] | 50 |

[1] Aqueous solutions.

The blue-green matrix was laminated to a paper receptor, Kromkote Cast Coated, 10 point paper as described in Example I. The matrix was exposed through the support side to a separation positive, the exposure was in a vacuum frame to the NuArc arc lamp for 5 seconds.

The matrix support was thermally stripped off, with the underexposed areas adhering to the receptor and the exposed area on the support. The blue-green image on the receptor was ferrotyped and post exposed as described in Example I and laminated to the magenta matrix. The sandwich was exposed with the receptor in register with the magenta printing, color separation positive. The same subsequent steps were performed and then the yellow matrix was processed in the same manner.

A well-defined, three-color positive image was reproduced on the receptor.

The process of the invention is applicable to any multicolor reproduction involving the thermal transfer of photopolymerized elements, and is of particular benefit in the color proofing of color prints that are used to making printing plates. The process of the invention can be adapted to either negative or positive color separation transparencies, thus it can be used for color proofing positive or negative printing plates.

The invention has the advantage that registration of the various images is accomplished during the exposure step at room temperature. No registration operation need be performed during the thermal transfer step, thus the problems created by elevated temperatures during registration are avoided, i.e., during the application of heat the images involved are already in registration and are in intimate contact. Additionally the process can provide lateral image reversal if it is desired.

What is claimed is:

1. In a process for color image reproduction where separate protopolymerizable elements each containing different colorants in solid photopolymerizable layers are separately exposed and the underexposed photopolymerizable areas thermally transferred, in order, to the same receptor to give a composite color image reproduction, the improvement which comprises laminating in turn each colored element to said receptor and exposing each separate laminate to a color separation transparency held in register with said receptor, said transparency's color reproduction is equivalent to the color in the particular laminate being exposed, said laminating, exposure, and thermal transfer of each successive element occurring in sequence to give a final composite color reproduction.

2. A process as described in claim 1 where a stripping layer is applied between said receptor and said successive unexposed elements.

3. A process for preparing multicolor reproductions from individual photopolymerizable elements where each element has a separate colorant in a photopolymerizable layer that is solid below 40° C. and tacky between 40° C. and about 220° C., said process comprises: (A) laminating a receptor to the photopolymerizable element containing a colorant equivalent to the color to be printed by a color separation transparency; (B) exposing said element through the color separation transparency; (C) heating and separating the exposed photopolymer areas from the unexposed photopolymerizable areas to give a colored image reproduction of said transparency in the form of transferred photopolymerizable colored material from the unexposed areas on said receptor; (D) exposing the imaged receptor to harden the polymer image; (E) laminating said imaged receptor to a second photopolymerizable element containing a different colorant from that of step (A); (F) exposing said laminating through a second color separation transparency held in register with said reproduction, said second transparency's color reproduction is equivalent to the colorant in said second element; and (G) again heating and separating the exposed photopolymer from the unexposed photopolymerizable areas, and exposing the imaged seceptor to give a multicolored positive reproduction.

4. A process as described in claim 3 where after each separation of said unexposed from said exposed photopolymer said positive reproduction on the receptor is ferrotyped to improve the color intensity.

5. A process as described in claim 3 where a thin stripping layer is applied to the outer photopolymerizable surface of said elements.

6. A process for preparing multicolor reproductions from individual photopolymerizable elements where each element has a transparent support and a separate colorant in an unexposed photopolymerizable layer that is solid below 40° C. and tacky between 40° C. and about 220° C., which process comprises: (A) laminating an image receptor to one of said individual photopolymerizable elements; (B) exposing said laminated element through a color separation transparency in contact with said transparent support, the color reproduction of said transparency being equivalent to the colorant in said element being exposed; (C) separating said laminate receptor and support under sufficient heat in excess of 40° C. to cause said unexposed photopolymerizable material to become tacky; (D) exposing said unexposed photopolymerizable material which separates with said receptor to give a hardened polymer image on said receptor; (E) laminating to the imagebearing surface of said receptor another of said elements which has a different colorant; (F) exposing said second lamination through a second color separation transparency held in register with said image previously on said receptor, the color reproduction of said transparency being equivalent to the colorant in said element being exposed; and (G) separating said laminate as in step (C) and exposing said receptor as in step (D) to give a composite multicolor reproduction.

7. A process as described in claim 6 where a stripping layer is applied before lamination between said receptor and each of said elements.

8. A process as described in claim 6 where prior to each exposure of said unexposed photopolymer on said receptor to obtain a hardened image said image is ferrotyped to improve its color intensity.

9. A process according to claim 6, wherein steps (A) through (G) are repeated and the photopolymerizable layers contain cyan, magenta, yellow, and black colorants, respectively, and the laminating is effected in any order.

References Cited

UNITED STATES PATENTS

| | | | |
|---|---|---|---|
| 2,993,788 | 7/1961 | Straw et al. | 96—49 X |
| 3,060,023 | 10/1962 | Burg et al. | 96—28 |

NORMAN G. TORCHIN, Primary Examiner

R. E. FICHTER, Assistant Examiner

U.S. Cl. X.R.

96—24, 30; 101—471